United States Patent [19]
Pezzani

[11] Patent Number: 5,747,835
[45] Date of Patent: May 5, 1998

[54] SERIAL ARRANGEMENT OF PHOTOTHYRISTORS

[75] Inventor: Robert Pezzani, Vouvray, France

[73] Assignee: SGS-Thomson Microelectronics S.A., Saint Genis, France

[21] Appl. No.: 526,508

[22] Filed: Sep. 11, 1995

[30] Foreign Application Priority Data

Sep. 16, 1994 [FR] France .................................. 94 11338

[51] Int. Cl.⁶ .......................... H01L 29/74; H01L 31/111
[52] U.S. Cl. .......................... 257/113; 257/116; 257/117; 257/118; 257/436; 257/466
[58] Field of Search .................................. 257/113, 114, 257/115, 116, 117, 118, 466, 686, 443, 444, 620, 432, 436

[56] References Cited

U.S. PATENT DOCUMENTS

| | | | |
|---|---|---|---|
| 4,216,487 | 8/1980 | Konishi et al. | 257/117 |
| 4,301,462 | 11/1981 | Lowry | 257/117 |
| 4,613,884 | 9/1986 | Angerstein et al. | 257/118 X |
| 5,023,685 | 6/1991 | Bethea et al. | 357/30 |
| 5,357,122 | 10/1994 | Okubora et al. | 257/466 X |

FOREIGN PATENT DOCUMENTS

| | | | |
|---|---|---|---|
| 55-134970 | 10/1980 | Japan | 257/115 |
| 56-112746 | 9/1981 | Japan | 257/116 |
| 58-157166 | 9/1983 | Japan | 257/116 |
| 5021817 | 1/1993 | Japan | 257/117 |
| 6021436 | 1/1994 | Japan | 257/118 |

OTHER PUBLICATIONS

Patent Abstracts of Japan, vol. 005, No. 055 (E–052), Apr. 16, 1981 & JP–A–56 007476 (Mitsubishi Electric Corp.).
Patent Abstracts of Japan, vol. 004, No. 175 (E–036), Dec. 3, 1980 & JP–A–55 120165 (NEC Corp.).

*Primary Examiner*—William Mintel
*Attorney, Agent, or Firm*—Wolf, Greenfield & Sacks, P.C.; James H. Morris; Richard F. Giunta

[57] ABSTRACT

A serial arrangement of photosensitive components of the planar-type has a first main surface on which a first photosensitive junction appears at the surface and a second main surface. The components are piled so that the second main surface of a component contacts the first main surface of the adjacent component. The second main surface of each component has a notch at its periphery along a lateral length corresponding at least to the distance between the photosensitive junction and the periphery.

48 Claims, 2 Drawing Sheets

SERIAL ARRANGEMENT OF PHOTOTHYRISTORS

BACKGROUND OF THE INVENTION

1. Field of the Invention

The present invention relates to the field of photothyristors, and more particularly to planar-type thyristors.

2. Discussion of the Related Art

FIGS. 1A and 1B are a top view and a schematic cross-sectional view, respectively, of a planar-type photo-thyristor. Conventional thyristors comprise a low-doped substrate 1 of a first conductivity type, for example of the N-type. A P-type first region 2 and, inside region 2, an N-type region 3 are successively formed on the upper surface of the substrate. The lower surface comprises a P-type layer 4. The structure is planar since the P and N regions of the upper surface are diffused inside a mask and their junctions end at the upper surface of the thyristor rather than its periphery. Such structures are particularly simple to fabricate and have a high break-down voltage. The upper N-type region 3 is coated with a metallization 6 and constitutes a cathode electrode K. The lower surface is coated with a metallization 7 and constitutes an anode electrode A.

In contrast to conventional thyristors, photo-thyristors do not have a gate metallization but are triggered through irradiation of the forward blocking junction, i.e., the junction between region 2 and substrate 1. This junction is hereinafter referred to as a "photosensitive junction". Irradiation is represented in FIG. 1B by arrows and mainly acts on region 9, drawn in dotted lines, near the surface of the photosensitive junction. Conventionally, a correctly positioned light-emitting diode (LED), with a suitable wavelength, is used to irradiate the photosensitive region of the thyristor. This region is close to the exposed surface of the junction between region 2 and substrate 1, in which the electric field extends in the forward blocking state. The photons generate electron-hole pairs which, due to the energy acquired in the electric field, are multiplied and cause the thyristor to trigger. These photons only reach the upper surface of the component. They are absorbed as soon as they reach the surface of the component and their density (thus, their efficiency) decreases under the surface. Accordingly, the surface of the component and mainly the surface area of the photosensitive junction should be lighted. Lateral lighting does not trigger the thyristor because it does not reach the junction region.

In some applications, for example when it is desired to cause triggering while the thyristor withstands forward voltages of a few kilovolts, several photothyristors are used in series. The thyristors are then arranged side by side in order to light their upper surfaces. This arrangement is cumbersome and rather large in size.

SUMMARY OF THE INVENTION

In one illustrative embodiment of the invention, a serial arrangement of photosensitive components is provided comprising a first photosensitive component and a second photosensitive component, each having a first surface, a second surface and at least one peripheral surface extending between the first and second surfaces. The second surface of the second photosensitive component contacts the first surface of the first photosensitive component. The first photosensitive component has a first photosensitive junction disposed along its first surface at a distance from its at least one peripheral surface. The second photosensitive component has a second photosensitive junction disposed along its first surface at a distance from its at least one peripheral surface, and a notch extending from its at least one peripheral surface by a distance equal to at least the distance from the at least one peripheral surface of the first photosensitive component to the first photosensitive junction.

In another illustrative embodiment of the invention, a serial arrangement of photosensitive components is provided comprising first and second photosensitive components, each having a first surface, a second surface and at least one peripheral surface extending between its first and second surfaces. The first photosensitive component includes a first photosensitive junction disposed along its first surface. The second photosensitive component includes a second photosensitive junction disposed along its first surface. The first and second photosensitive components are arranged so that the first surface of the first photosensitive component is disposed opposite the second surface of the second photosensitive component.

In another illustrative embodiment of the invention, a photosensitive component is provided comprising a first surface, a second surface and at least one peripheral surface extending between the first and second surfaces. The first surface has a first photosensitive junction disposed along it. The second surface includes a notch.

In another illustrative embodiment of the invention, a method is provided for forming a serial arrangement of at least two photosensitive components including first and second photosensitive components, each having a first surface, a second surface and at least one peripheral surface extending between its first and second surfaces. The first photosensitive component has a first photosensitive component disposed along its first surface, and the second photosensitive component has a second photosensitive junction disposed along its first surface. The method comprises a step of arranging the at least two photosensitive components so that the second surface of the second photosensitive component is disposed opposite the first surface of the first photosensitive component.

In another illustrative embodiment of the invention, a method is provided for triggering at least one photosensitive component having a photosensitive junction. The method comprises the steps of: (a) projecting a beam of light along a path; and (b) disposing at least one reflective surface in the path that reflects the beam of light toward the photosensitive junction to trigger the at least one photosensitive component.

In another illustrative embodiment, a serial arrangement of photosensitive components is provided comprising first and second photosensitive components, each having a first surface, a second surface and at least one peripheral surface extending between its first and second surfaces. The first photosensitive component has a first photosensitive junction disposed along its first surface. The second photosensitive junction has a second photosensitive junction disposed along its first surface. The second photosensitive component includes means for reflecting a light beam toward the first photosensitive junction.

In one illustrative embodiment of the present invention, a serial connection of planar-type photosensitive components is provided comprising a first photosensitive junction appearing on the first main surface and a second main surface. The components are piled so that the second main surface of a component contacts the first main surface of the adjacent component. The second main surface of each component has a notch at its periphery along a lateral length corresponding at least to the distance between the photosensitive junction and the periphery.

According to an embodiment of the invention, the notch is coated with a metallization which also coats the second main surface of each component.

According to an embodiment of the invention, the notch is concave.

According to an embodiment of the invention, the notch is formed by chemically etching a silicon wafer from which the components are formed.

According to an embodiment of the invention, at least one light source is disposed at the periphery of the pile.

According to an embodiment of the invention, the components are thyristors.

The foregoing and other objects, features, aspects and advantages of the invention will become apparent from the following detailed description of the present invention when taken in conjunction with the accompanying drawings.

DETAILED DESCRIPTION

Figure 1A:
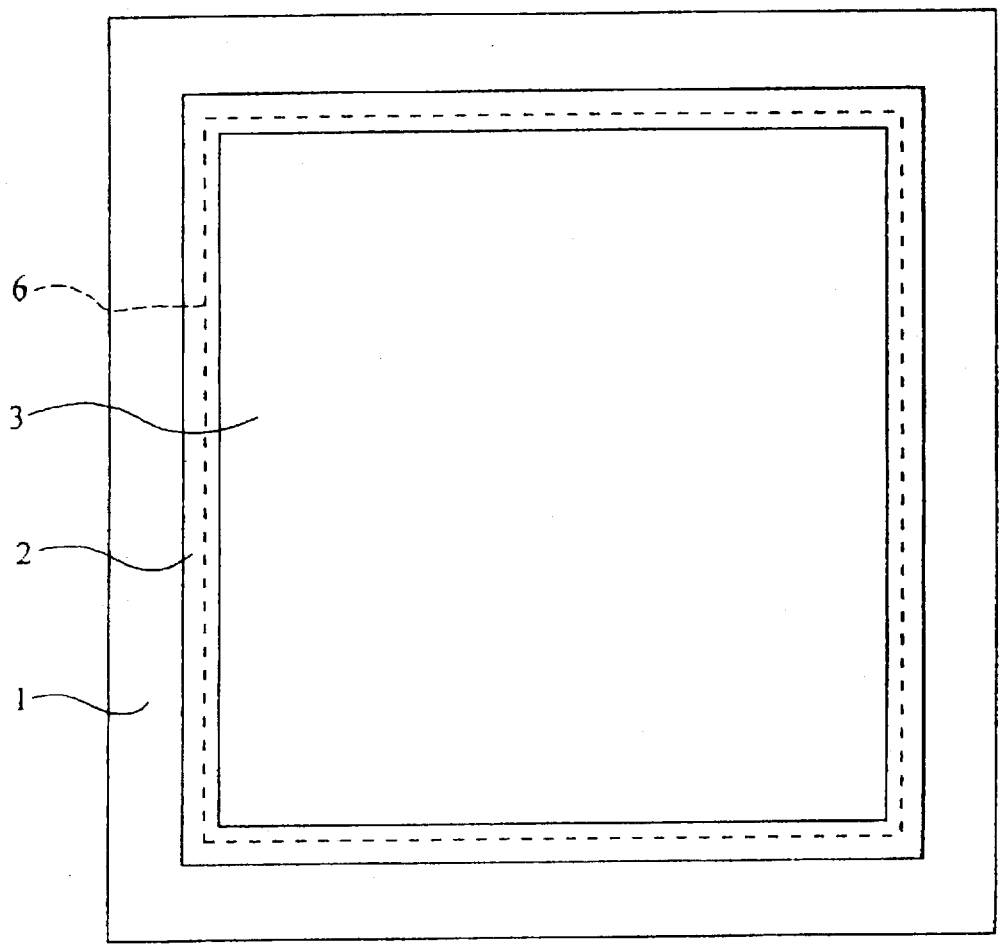
FIGS. 1A and 1B, above described, are a top view and a schematic cross-sectional view, respectively, of a planar photothyristor.
Figure 1B:
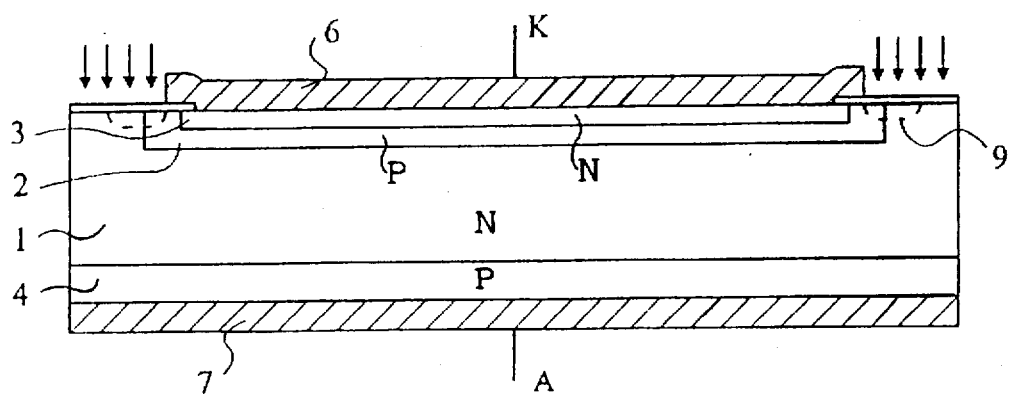
Figure 2:
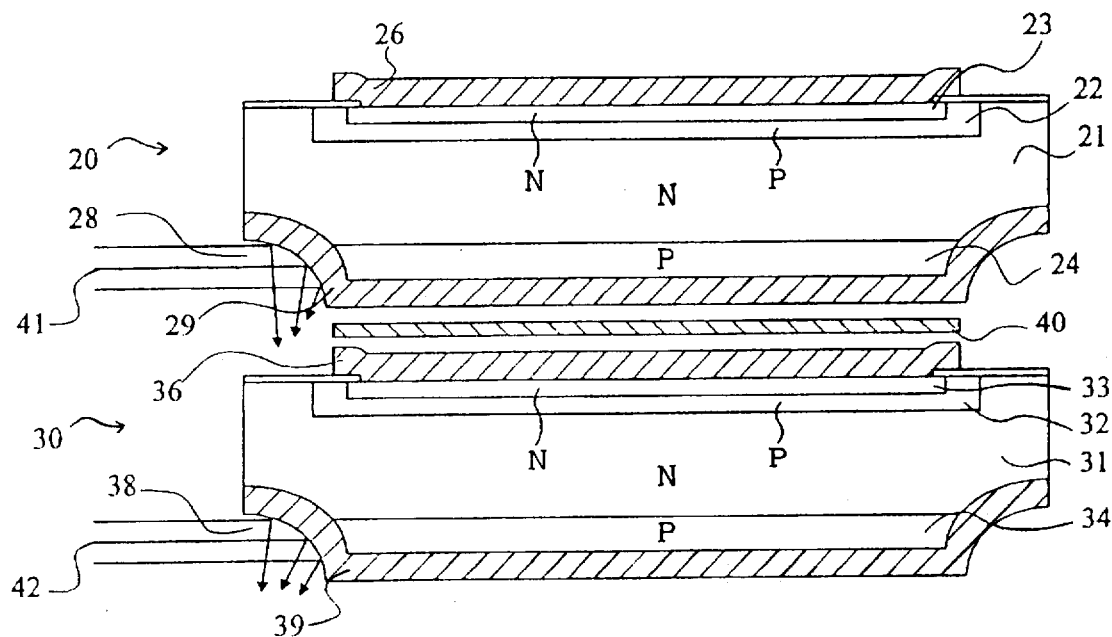
FIG. 2 is a cross-sectional view of an assembly of photothyristors according to the present invention.

FIG. 2 represents two planar photothyristors 20 and 30, each being similar in many respects to the thyristor in FIG. 1A and 1B. The two photothyristors 20 and 30 respectively comprise a substrate 21, 31, a P-type region 22, 32, an N-type region 23, 33, and a P-type lower layer 24, 34, that correspond to elements 1, 2, 3 and 4 in FIGS. 1A and 1B. The photothyristors also comprise upper cathode metallizations 26, 36, respectively, that correspond to metallization 6.

The lower surface of each thyristor 20 and 30 differs from the one of the thyristor FIG. 1B. The periphery of this lower surface is widely grooved so as to form a lateral notch 28, 38. This notch has a lateral size larger than the distance, on the upper surface, separating the periphery of each thyristor from the exposed region of the junctions 22, 32. The lateral notch 28, 38 is metallized simultaneously with the lower surface with respective metallizations 29, 39.

The two thyristors 20, 30, and others (not shown) are piled and can be soldered together, using a solder preform 40 disposed there between. A light beam 41, 42 incident on the periphery of the piled thyristors is reflected by the mirror formed by metallization 29 of notch 28 toward the exposed junction area of the adjacent lower thyristor. The metallizations that are conventionally used to form anode and/or cathode metallizations generally constitute suitable reflectors. For example, metallizations formed from aluminum, gold, titanium and nickel, whether alone or possibly sandwiched in alloys with silicon, etc., can be used.

Preferably, notch 28, 38 is concave. The curvature of the notch is preferably selected so that the light beam is not only reflected toward the lower surface, but focussed on the photosensitive area as well. In the field of semiconductors, where single elements are formed from a large surface silicon wafer which is sawn off into single elements, concave notches can be conventionally formed as follows: prior to sawing the areas corresponding to the thyristor limits, grooves, which will subsequently constitute the notches, are chemically etched.

If the notches are sufficiently wide and deep, metallization 29, 39 contacts both the P-type layers 24, 34 and substrates 21, 31, respectively. In practice, this is not an impairment. First, the performance of the junction between the N-type substrate and the lower P-type region acts mainly on the reverse breakover voltage of the thyristor. However, this reverse breakover voltage is generally not a major parameter for conventional uses of photothyristors. Second, the contact of the rear surface metallization with the substrate does not form a low impedance short-circuit. Indeed, the resistivity of the N-type substrate is high (usually approximately 25 ohmscm or $10^{14}$ atoms/cm$^3$). With such concentrations, there is no ohmic contact between the metallization and the substrate, i.e., with a 1-volt voltage, the contact resistance is a few kilohms. Thus, practically, the metallization does not short the rear junction and does not substantially impair the thyristor's sensitivity.

Figure 3:
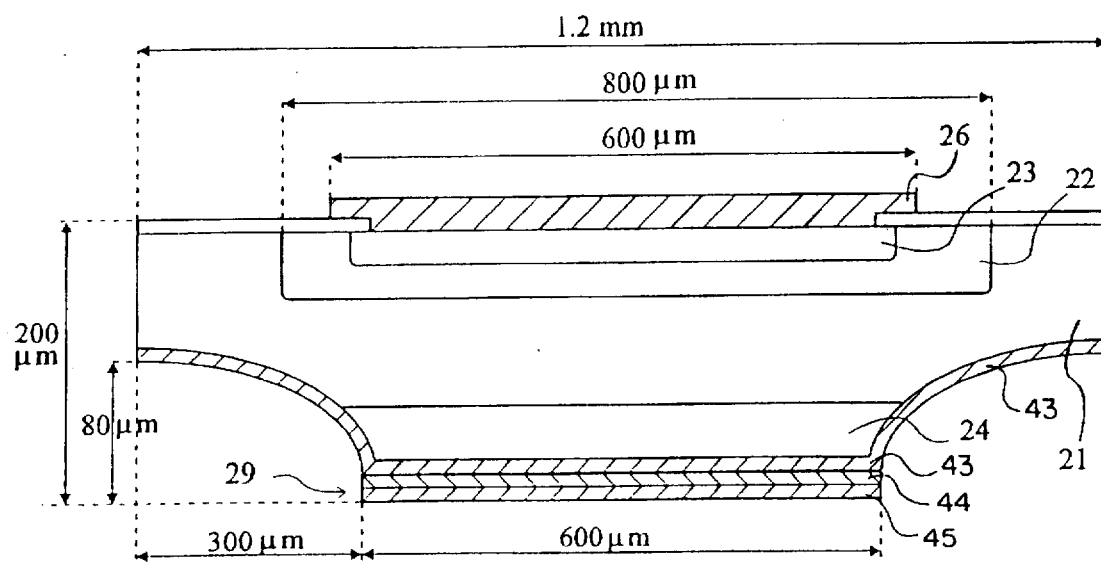
FIG. 3 is a side view, with size indications, of an exemplary embodiment of a photothyristor according to the present invention.

By way of example, the present invention can be applied to a square photothyristor having sizes such as indicated in FIG. 3. Such a thyristor can withstand a d.c. voltage of approximately 600 volts and can conduct an average current of approximately 1 A (with current peaks of approximately 50 A).

The characteristics of the conductive areas are, for example, as follows:

substrate 21: dopant concentration=$10^{14}$ at./cm$^3$,

P regions 22, 24: $x_s$=16 µm, $C_s$=$10^{17}$ at./cm$^3$,

N region 23: $x_s$=8 µm, $C_s$=$2.10^{19}$ at./cm$^3$, where $x_s$ designates the penetration deepness of the dopants and $C_s$ the surface concentration of the dopants.

Up to ten photothyristors such as the ones of FIG. 3 can be piled to reach a breakover voltage of approximately 6,000 volts.

Conventionally, the piled thyristors are triggered by a single photodiode, but more complex arrangements can be used. In fact, not all of the photothyristors need to be optically triggered, since as soon as a sufficient number of photothyristors is triggered, the other thyristors will break over.

In the embodiment discussed above in connection with FIG. 2, the lower surface is formed from a single metallization layer 29. The lower surface can also be formed from multiple layers as shown in FIG. 3. A first metallization layer 43 can be achieved, for example with aluminum, on the whole lower surface, followed by one or more metallizations over the planar portion of the lower surface, for example a second metallization layer 44 with nickel and a third metallization layer 45 with gold. Thus, a soft soldering can be used, for example with tinlead, that wets gold but not aluminum so that the soldering will not fill the notch. This can be achieved by firstly depositing aluminum 43, coating the grooves with resin, depositing additional metallizations, and dissolving the resin, which lifts off the metallizations coating the resin.

As is apparent to those skilled in the art, various modifications can be made to the above disclosed preferred embodiments. For example, the polarities can be inverted, and the invention similarly applies to diodes, triacs and other photosensitive components of the planar-type.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A serial arrangement of photosensitive components, comprising:

a first photosensitive component having a first photosensitive junction, the first photosensitive component including first and second surfaces and at least one peripheral surface extending between the first and second surfaces of the first photosensitive component, the first photosensitive junction being disposed along the first surface of the first photosensitive component at a distance from the at least one peripheral surface of the first photosensitive component;

a second photosensitive component having a second photosensitive junction, the second photosensitive component including first and second surfaces and at least one peripheral surface extending between the first and second surfaces of the second photosensitive component, the second photosensitive junction being disposed along the first surface of the second photosensitive component, the second surface of the second photosensitive component contacting the first surface of the first photosensitive component, the second surface of the second photosensitive component having a notch extending from the at least one peripheral surface of the second photosensitive component by a distance equal to at least the distance from the at least one peripheral surface of the first photosensitive component to the first photosensitive junction.

2. The serial arrangement of photosensitive components of claim 1, wherein the second surface of the first photosensitive component, the second surface of the second photosensitive component and the notch each has a coating of a first metal.

3. The serial arrangement of photosensitive components of claim 1, wherein the notch is concave.

4. The serial arrangement of photosensitive components of claim 1, wherein the first and second photosensitive components are formed from a silicon wafer, and wherein the notch is chemically etched from the silicon wafer.

5. The serial arrangement of photosensitive components of claim 2, wherein the second surface of the second photosensitive component includes a first portion that defines the notch and a second portion that is planar, and wherein the second portion includes a coating of a second metal.

6. The serial arrangement of photosensitive components of claim 1, in combination with at least one light source disposed to project light at the at least one peripheral surface of the second photosensitive component.

7. The serial arrangement of photosensitive components of claim 1, wherein the first and second photosensitive components are photothyristors.

8. The serial arrangement of photosensitive components of claim 5, wherein the second portion of the second surface of the second photosensitive component further includes a coating of a third metal.

9. The serial arrangement of photosensitive components of claim 8, wherein the coating of the third metal contacts the first surface of the first photosensitive component.

10. The serial arrangement of photosensitive components of claim 9, wherein the coating of the third metal is soldered to the first surface of the first photosensitive component.

11. The serial arrangement of photosensitive components of claim 9, wherein the first and second photosensitive components are arranged so that the first photosensitive junction disposed along the first surface of the first photosensitive component is aligned with the first portion of the second surface of the second photosensitive component.

12. A serial arrangement of photosensitive components, comprising:

a first photosensitive component having a first surface, a second surface and at least one peripheral surface extending between the first and second surfaces, the first photosensitive component further including a first photosensitive junction disposed along its first surface; and a second photosensitive component having a first surface, a second surface and at least one peripheral surface extending between the first and second surfaces of the second photosensitive component, the second photosensitive component further including a second photosensitive junction disposed along its first surface, the first and second photosensitive components being arranged so that the first surface of the first photosensitive component is disposed opposite the second surface of the second photosensitive component.

13. The serial arrangement of photosensitive components of claim 12, wherein the second surface of the second photosensitive component includes a notch.

14. The serial arrangement of photosensitive components of claim 13, wherein the notch is concave.

15. The serial arrangement of photosensitive components of claim 13, wherein the first and second surfaces of the second photosensitive component each has a greater surface area than the at least one peripheral surface of the second photosensitive component.

16. The serial arrangement of photosensitive components of claim 15, wherein the first and second photosensitive components are arranged so that the first photosensitive junction is disposed opposite the notch.

17. The serial arrangement of photosensitive components of claim 16, wherein the notch extends from the at least one peripheral surface of the second photosensitive component by a distance equal to at least a distance from the at least one peripheral surface of the first photosensitive component to an edge of the first photosensitive junction that is farthest from the at least one peripheral surface of the first photosensitive component.

18. The serial arrangement of photosensitive components of claim 13, wherein the first and second photosensitive components are arranged so that the first photosensitive junction is disposed opposite the notch.

19. The serial arrangement of photosensitive components of claim 18, wherein the notch has a light reflective surface.

20. The serial arrangement of photosensitive components of claim 19, wherein the notch is concave.

21. The serial arrangement of photosensitive components of claim 20, wherein the notch extends from the at least one peripheral surface of the second photosensitive component by a distance equal to at least a distance from the at least one peripheral surface of the first photosensitive component to an edge of the first photosensitive junction that is farthest from the at least one peripheral surface of the first photosensitive component.

22. The serial arrangement of photosensitive components of claim 21, wherein the second surface of the second photosensitive component is soldered to the first surface of the first photosensitive component.

23. The serial arrangement of photosensitive components of claim 13, wherein the second surface of the second photosensitive component includes a planar portion coated with at least one layer of a material.

24. The serial arrangement of photosensitive components of claim 23, wherein the at least one layer of material coating the planar portion contacts the first surface of the first photosensitive component.

25. The serial arrangement of photosensitive components of claim 24, wherein the first and second photosensitive components are arranged so that the first photosensitive junction is disposed opposite the notch.

26. The serial arrangement of photosensitive components of claim 25, wherein the notch is concave.

27. The serial arrangement of photosensitive components of claim 23, wherein the at least one layer of material coating the planar portion of the second surface of the second photosensitive component is soldered to the first surface of the first photosensitive component.

28. The serial arrangement of photosensitive components of claim 27, wherein the first and second photosensitive components are arranged so that the first photosensitive junction is disposed opposite the notch.

29. The serial arrangement of photosensitive components of claim 28, wherein the notch is concave.

30. The serial arrangement of photosensitive components of claim 29, wherein the first portion of the second surface of the second photosensitive component has a light reflective surface.

31. The serial arrangement of photosensitive components of claim 12, wherein the second surface of the second photosensitive component is connected to the first surface of the first photosensitive component.

32. The serial arrangement of photosensitive components of claim 12, wherein at least a portion of the second surface of the second photosensitive component has a light reflective surface.

33. The serial arrangement of photosensitive components of claim 32, wherein the at least a portion of the second surface of the second photosensitive component is disposed to reflect light toward the first photosensitive junction.

34. A photosensitive component comprising:
   a first surface that includes a first photosensitive junction disposed along said first surface, the first photosensitive junction being activated by activation light waves;
   a second surface that includes a notch having a surface that is reflective of the activation light waves; and
   at least one peripheral surface extending between the first surface and the second surface.

35. The photosensitive component of claim 34, wherein the second surface includes a first portion that defines the notch and a second portion that is planar.

36. The photosensitive component of claim 35, wherein the first portion extends from the at least one peripheral surface by a distance equal to at least a distance from the at least one peripheral surface to an edge of the photosensitive junction that is furthest from the at least one peripheral surface.

37. The photosensitive component of claim 36, wherein the notch is concave.

38. The photosensitive component of claim 35, wherein the second portion of the second surface is susceptible to wetting by a soldering material, and wherein the first portion of the second surface is formed from a material that is not susceptible to wetting by the soldering material.

39. The photosensitive component of claim 38, wherein the first portion extends from the at least one peripheral surface by a distance equal to at least the distance from the at least one peripheral surface to an edge of the photosensitive junction that is furthest from the at least one peripheral surface.

40. The photosensitive component of claim 39, wherein the notch is concave.

41. The photosensitive component of claim 35, wherein said photosensitive component is a photothyristor.

42. The photosensitive component of claim 34, wherein the notch is concave.

43. A serial arrangement of photosensitive components, comprising:
   a first photosensitive component having a first surface, a second surface and at least one peripheral surface extending between the first and second surfaces, the first photosensitive component further including a first photosensitive junction disposed along its first surface; and
   a second photosensitive component having a first surface, a second surface and at least one peripheral surface extending between the first and second surfaces of the second photosensitive component, the second photosensitive component including means for reflecting a light beam toward the first photosensitive junction.

44. The serial arrangement of photosensitive components of claim 43, wherein a second photosensitive junction is disposed along the second surface of the second photosensitive component.

45. The serial arrangement of photosensitive components of claim 44, further comprising a third photosensitive component having a first surface, a second surface and at least one peripheral surface extending between the first and second surfaces, the third photosensitive component further including a third photosensitive junction disposed along its first surface and means for reflecting the light beam toward the second photosensitive junction.

46. The photosensitive component of claim 34, wherein the notch includes a coating that is reflective of the activation light waves.

47. The photosensitive component of claim 46, wherein the second surface includes a first portion that defines the notch and a second portion that is planar.

48. The photosensitive component of claim 47, wherein the second portion of the second surface is susceptible to wetting by a soldering material, and wherein the first portion of the second surface is formed from a material that is not susceptible to wetting by the soldering material.

* * * * *